US006794870B2

(12) United States Patent
Hennig

(10) Patent No.: US 6,794,870 B2
(45) Date of Patent: Sep. 21, 2004

(54) METHOD FOR MEASURING THE MAGNETIC RESONANCE (NMR) BY DRIVEN EQUILIBRIUM

(75) Inventor: Jurgen Hennig, Freiburg (DE)

(73) Assignee: Universitätsklinikum Freiburg (DE)

( * ) Notice: Subject to any disclaimer, the term of this patent is extended or adjusted under 35 U.S.C. 154(b) by 35 days.

(21) Appl. No.: 10/097,840

(22) Filed: Mar. 13, 2002

(65) Prior Publication Data
US 2002/0167318 A1 Nov. 14, 2002

(30) Foreign Application Priority Data
Mar. 16, 2001 (DE) .......................................... 101 12 704

(51) Int. Cl.[7] ................................................ G01V 3/00
(52) U.S. Cl. ........................ 324/309; 324/314; 324/307
(58) Field of Search ................................ 324/300–322

(56) References Cited

U.S. PATENT DOCUMENTS

| 4,973,906 A | * | 11/1990 | Bernstein .................... 324/309 |
| 5,347,216 A | * | 9/1994 | Foo ............................. 324/309 |
| 5,541,514 A | | 7/1996 | Heid et al. |
| 5,545,992 A | | 8/1996 | Foo |
| 6,163,153 A | * | 12/2000 | Reiderman et al. ......... 324/314 |
| 6,339,332 B1 | | 1/2002 | Deimling |

FOREIGN PATENT DOCUMENTS

| DE | 44 27 497 A1 | 2/1996 |
| DE | 196 30 758 A | 2/1997 |
| DE | 198 36 612 A1 | 2/2000 |
| DE | 199 31 292 A1 | 2/2001 |
| JP | 2001029327 A | 2/2001 |

OTHER PUBLICATIONS

H.Y. Carr, "Steady–State Free Precession in Nuclear Magnetic Resonance", Physical Review, Dec. 1, 1958, pp. 1693–1701, vol. 112, No. 5.

A. Oppelt et al., "FISP: Eine Neue Schnelle Puls–Sequenz fur Die Kernspintomographie", Electromedia 54 (1986), Heft 1, pp. 15–18 Germany.

Hennig J. et al., "Optimization of Signal Behavior in the Transition to Driven Equilibrium in Steady–State Free Precession Sequences", Magnetic Resonance in Medisine, Nov. 2002, Wiley, USA Bd. 48, No. 5, pp. 801–809, Not Prior Art, date no good.

(List continued on next page.)

Primary Examiner—Christopher W. Fulton
Assistant Examiner—Tiffany A. Fetzner
(74) Attorney, Agent, or Firm—Walter A. Hackler

(57) ABSTRACT

A method of MRT according to the principle of signal generation in the driven equilibrium (DE) or also steady state free precession (SFP) wherein a periodic sequence of RF pulses with a flip angle α is applied with a time delay TR wherein the phase of these pulses is alternated in subsequent steps, is characterized in that the periodic sequence of RF pulses is preceded by a sequence of (n+1) pulses for which the following conditions are valid:

a first excitation pulse with preferred flip angle $\alpha_0 = 90°$ precedes the subsequently equidistant sequence of RF pulses at a preferred separation TR/2, the flip angle $\alpha_1$ of the subsequent pulse is larger than α and identical or approximately identical to 180°, the flip angle $\alpha_i$ of the i-th pulse in the region i=2 ... n is selected such that $\alpha_i \leq \alpha_{i-1}$ and $\alpha_i \geq \alpha$ and the phases of these pulses alternate.

This permits transfer from the steady state to the DE after few excitation periods such that fluctuating signals of off-resonance spins are largely eliminated and moreover, in the transfer to DE, signals of a higher amplitude compared to normal DE are generated which optimise image quality and contrast.

10 Claims, 10 Drawing Sheets

OTHER PUBLICATIONS

J. Hennig et al., "Optimization of Steady State Free Precession Sequences by Continuous Transition Into Driven Equilibrium (Tide)" ISMRM Tenth Scientific Meeting, Honolulu, Hawaii, USA, May 16–24, 2002, p. 378, Not Prior Art, date no good.

D.G. Nishimura at al., "Analysis and Reduction of the Transient Response in SSFP Imaging" ISMRM Eighth Scientific Meeting, Denver, Colorado, USA, Apr. 1–7, 2000, p. 301.

Williams C F M et al., "Sources of Artifact and Systematic Error in Quantitative Snapshot Flash Imaging and Methods for Their Elimination" Magnetic Resonance in Medicine, Academic Press, Duluth, MN, US, Bd. 41, No. 1, 1999, pp. 63–71.

* cited by examiner

METHOD FOR MEASURING THE MAGNETIC RESONANCE (NMR) BY DRIVEN EQUILIBRIUM

BACKGROUND OF THE INVENTION

The invention concerns a method of NMR (=nuclear magnetic resonance) tomography (=MRT) for generating NMR gradient echo signals according to the principle of signal generation in the driven equilibrium (DE) or also called steady state free precession (SFP) wherein a periodic sequence of radio frequency pulses with a flip angle $\alpha$ is applied with a time delay TR, wherein the phase of these radio frequency pulses is alternated in subsequent steps.

A SFP signal is generated by a continuous sequence of radio frequency pulses and was introduced by Carr as early as 1958 (Phys. Rev. 112, 1693 (1958)). Carr was able to show that implementation of the method with equidistant radio frequency pulses with constant amplitude and alternating phase produces a particularly high signal intensity of the SFP signal of on-resonance spins.

In 1986, this principle was converted by a FISP method (in the meantime called true FISP) into a method of MR imaging (A. Oppelt et al. electromedica 54, 15 (1986)). All gradients are switched such that their integral from the center of a pulse to the center of the subsequent pulse is zero. Subsequent pulses have flip angles $\alpha$ and alternating phases: P1, P3, P5 . . . =$\alpha$, P2, P4, P6 . . . =$-\alpha$. The temporal separation between 2 pulses is called repetition time TR.

The problem with implementation is thereby the fact that the transition into the resulting signal steady state is effected only gradually within a time period determined by T1 relaxation. Until this steady state has been reached, periodic signal fluctuations occur which produce strong image artefacts when using the sequence for MRT (see FIG. 2).

Suppression of this initial signal fluctuation is achieved in that before the continuous sequence of radio frequency pulses, one single pulse with a flip angle $\alpha/2$ is applied with a time delay of TR/2 (Deimling, M. DE 44 27 497 A1). This suppresses the initial signal modulations and merely a monotonic signal change into the steady state takes place (FIG. 3).

Suppression of signal modulation is explained on the basis of observation of the subsequent signals according to FIG. 4, wherein the radio frequency pulses are chosen to be applied each with a radio frequency field with a phase parallel to the y-axis of the transverse plane. The diagram of transverse magnetization Mx vs. Mz shows that the magnetization vector of the steady state magnetization Mss is tilted relative to the z-axis by an angle $\alpha/2$ such that Mss of subsequent radio frequency pulses is flipped between +−Mss. Initialization with $\alpha/2$ brings the original z-magnetization M0 to the correct tilting angle and the magnetization vector is transferred to Mss in subsequent radio frequency pulses corresponding to T1 and T2 relaxation wherein the signals (=absolute amount of the Mx-magnetization) decay monotonously towards Mss(x) and show no modulation.

This is true only for so-called on-resonance spins which experience no phase-change during TR. In MR tomography applications (=MRT) this condition is not met even for very small repetition times TR wherein TR is determined substantially by the switching speeds of the magnetic field gradients.

The magnetic field homogeneities dephase the spins by a phase angle of $\Delta\phi$ between two excitations. With TR=4 ms, $\Delta\phi=90°$ for an off-resonance frequency is e.g. $\Delta\Omega$ of $\Delta\phi/$(TR* 360°)=66 Hz. This corresponds to an inhomogeneity of 1 ppm at a resonance frequency of 63 MHz at 1.5 tesla field strength. Such inhomogeneities cannot be avoided in applications on humans due to the occurring susceptibility effects.

FIG. 5 shows the signal development in a method optimised according to DE 44 27 497 A1 as a function of $\Delta\phi$. It can be clearly seen that spins with $\Delta\Omega$ unequal 0 experience modulation over the first excitation periods.

The corresponding signal intensities for $\Delta\phi=0°$, 180° and 360° are shown in FIG. 6. Transfer of the modulations into the steady state amplitude which is characteristic for $\Delta\phi$ is very slow. These modulations produce image artefacts. The behavior differences of the spins which are characterized by $\Delta\phi=0°$ and $\Delta\phi=360°$ can be explained in that these spins are mutually dephased by 180° in the initial period TR/2 according to the method of DE 44 27 497 A1.

A further disadvantageous property of the method according to DE 44 27 497 A1 consists in that application of the small flip angle $\alpha/2$ for initialisation of the steady state sequence renders access to only a relatively small part of the originally present magnetization M0 corresponding to M0 sin $\alpha/2$).

In contrast thereto, it is the object of the present invention to further improve a method of the above-described type such that the above-discussed disadvantages can be eliminated.

SUMMARY OF THE INVENTION

In accordance with the invention, this object is achieved in an effective fashion, in that the periodic sequence of radio frequency pulses is preceded by a sequence of (n+1) radio frequency pulses with the following valid conditions:

a first excitation pulse with preferred flip angle $\alpha_0=90°$ precedes the subsequently equidistant sequence of radio frequency pulses at a preferred separation TR/2, the flip angle $\alpha_1$ of the subsequent radio frequency pulse is larger than $\alpha$ and equal or approximately equal to 180°, the flip angle $\alpha_i$ of the i-th radio frequency pulse in the region i=2 . . . n is selected such that $\alpha_i$ is smaller or equal to $\alpha_{i-1}$ and larger or equal to $\alpha$ and the phases of these radio frequency pulses alternate.

Further advantages of the invention can be extracted from the description and the drawing. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and explained in more detail with reference to embodiments.

DETAILED DESCRIPTION OF THE PREFERRED EMBODIMENT

The inventive method refers to the generation of NMR signals according to the principle of signal generation in the driven equilibrium (DE) or also steady state free precession (SFP). In contrast to prior art, the inventive method permits transfer from the steady state into the DE after a few excitation periods such that fluctuating signals from off-resonance spins are largely prevented and moreover, in the transition to DE, signals of a higher amplitude are generated in correspondence with DE which can be used in particular during application of the method in MRT for optimising the image quality and the contrast.

In the inventive method, a steady state (=balanced state) sequence with flip angles $\alpha$ and alternating phase are preceded by n+1 pulses with different flip angles $\alpha_{0...n}$ wherein the following features are met in the preferred implementation:

initialisation of the sequence is effected with a radio frequency pulse of a flip angle of $\alpha_0>\alpha/2$. Generally $\alpha_0=90°$. This radio frequency pulse preferably precedes the sequence with a time delay of TR/2 analogously to the method described in DE 44 27 497 A1.

all $\alpha_{1...n}$ are larger than $\alpha$ and are selected such that the transverse magnetization $Mtr_{1...n}$ formed at each reading time is formed symmetrically or almost symmetrically to the z axis. After initialisation with a 90° pulse, $\alpha_1$ is set to 180° or at least close to 180°. The flip angles of the subsequent radio frequency pulses drop monotonically to $\alpha$ wherein their phase alternates.

Accurate selection of $\alpha_{1...n}$ thereby depends on the desired signal intensities such that there are a plurality of possible and reasonable values for $\alpha_{1...n}$ within the scope of the defined conditions.

In a particularly simple and hence often preferred implementation, linear variation between $\alpha_1=180°$ and $\alpha_n=\alpha$ is possible, wherein n is a freely selectable parameter.

Figure 1:
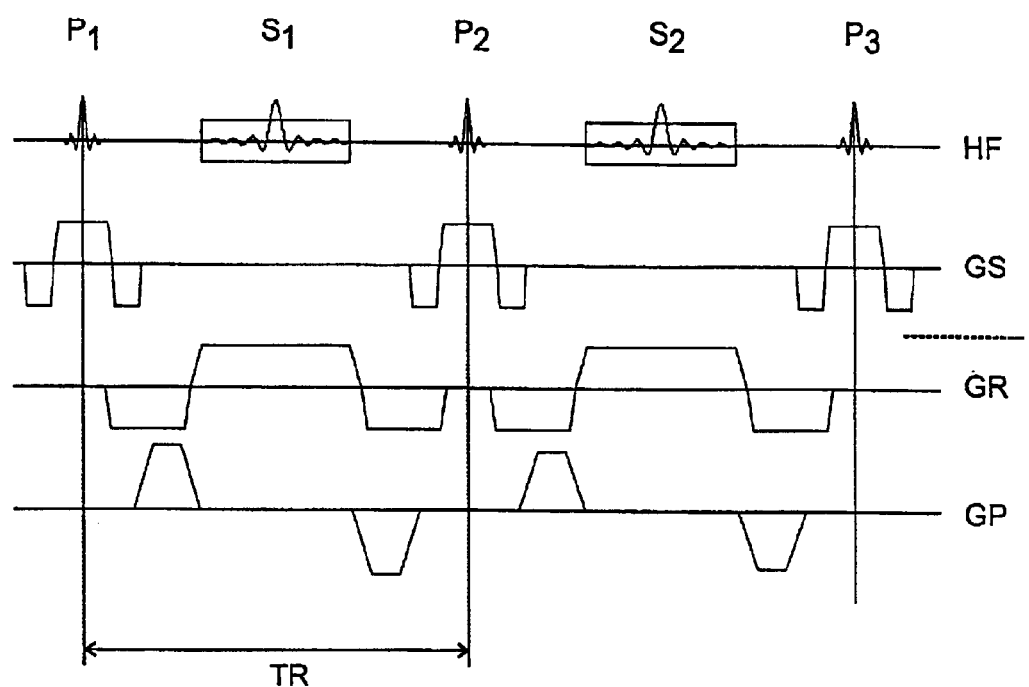
FIG. 1 shows a scheme of a trueFISP sequence, wherein HF, GS, GR and GP characterize the radio frequency pulses P1, P2, P3 and the signals S1, S2; GS is the slice selection gradient, GR is the read gradient and GP is the phase encoding gradient.
Figure 2:
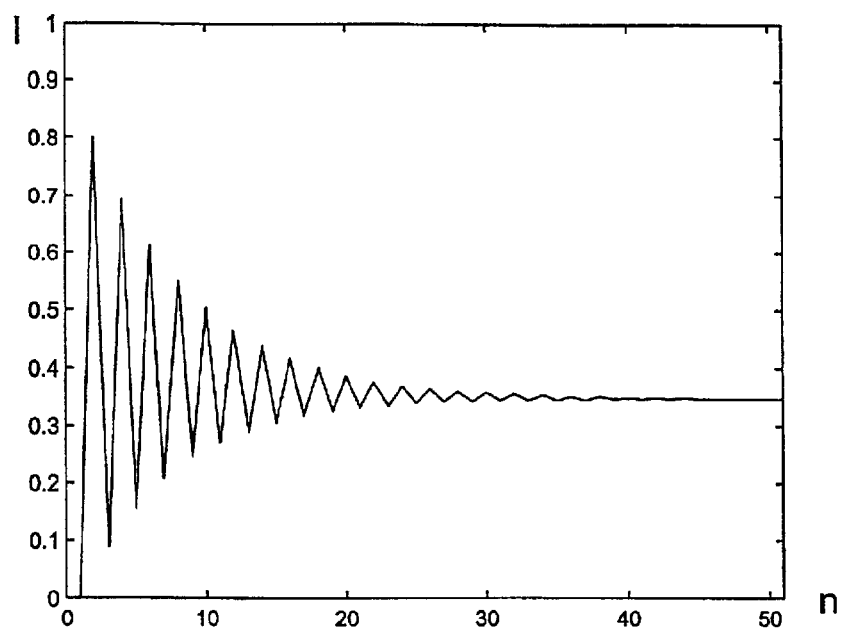
FIG. 2 shows the intensities I of the signals $S_{1 \ldots n}$ as a function of n, wherein for the simulation calculations, the following parameters were selected: TR=4 ms, T1=50 ms, T2=25 ms, $\alpha=60°$.
Figure 3:
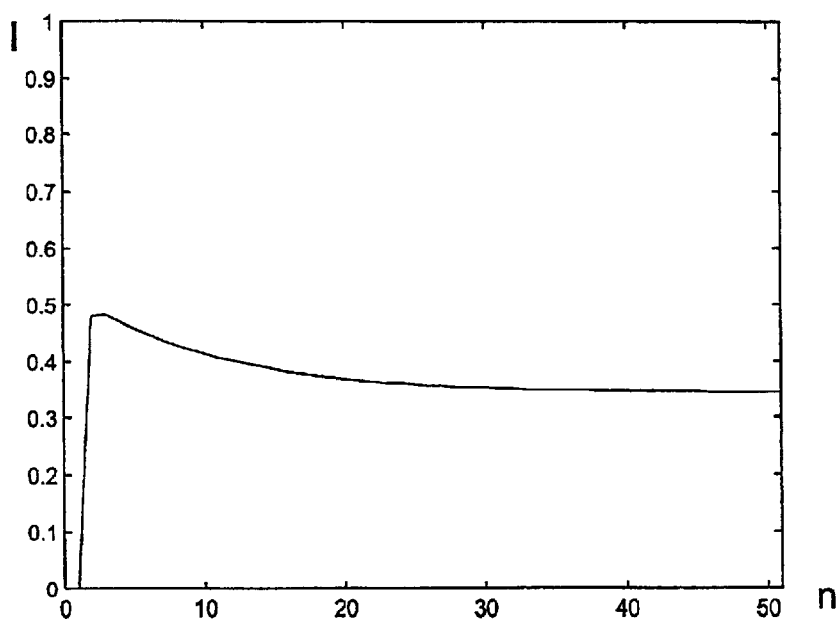
FIG. 3 equals FIG. 2, however, with an initial pulse with a flip angle of 30° which is applied 2 ms before the sequence.
Figure 4:
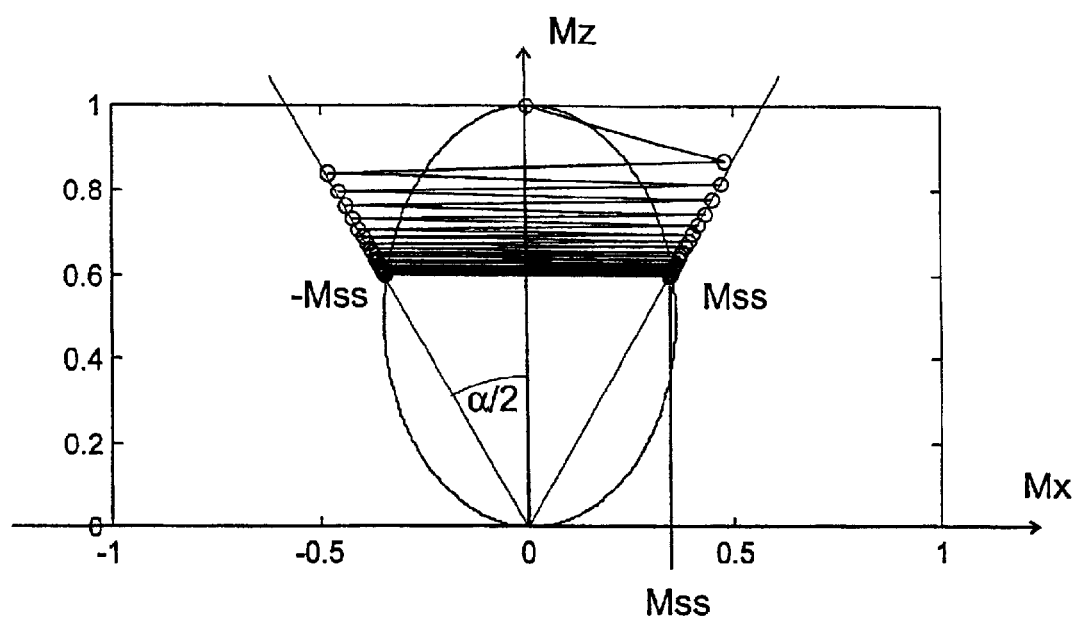
FIG. 4 shows the position of the magnetization vectors M in the x-z plane during application of RF pulses whose B1 field is oriented along the y axis (perpendicular to the plane of the image) during application of the method according to DE 44 27 497 A1; wherein the ellipse characterizes the signal steady state for the selected parameters of T1=50 ms and T2=25 ms as a function of $\alpha$, and wherein the steady state for a certain $\alpha$ (here $\alpha=60°$) corresponds exactly to the point of intersection of the ellipse with a straight line inclined relative to the z axis by +−$\alpha$/2.
Figure 5:
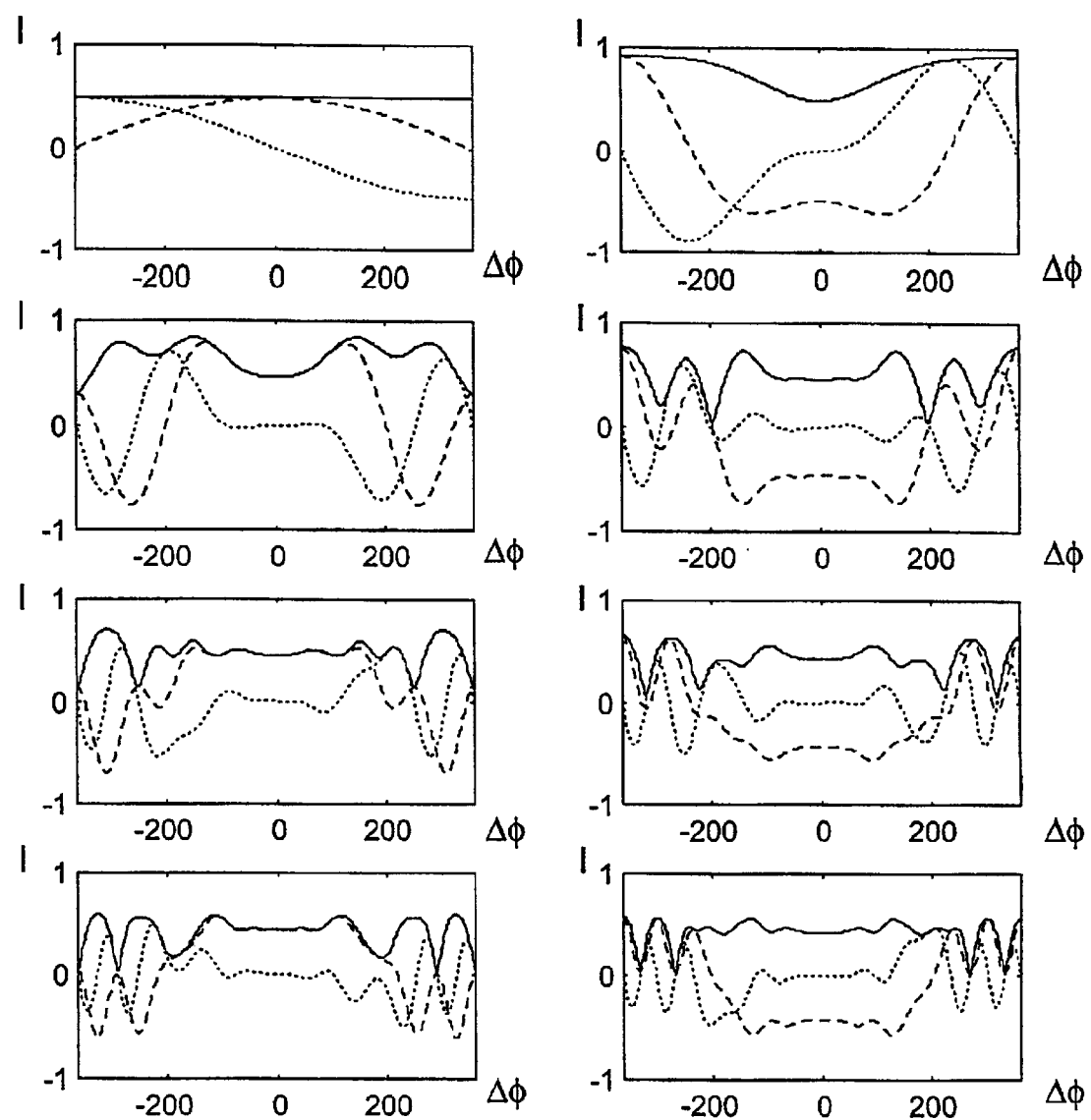
FIG. 5 shows the x (broken lines) and y (dotted line) magnetization and the signal intensity I (full line) as a function of dephasing $\Delta\phi$ (in degrees) during TR over the first 8 signals. I corresponds to the amount of transverse magnetization. The B1 field of the excitation pulse is oriented along y.
Figure 6:
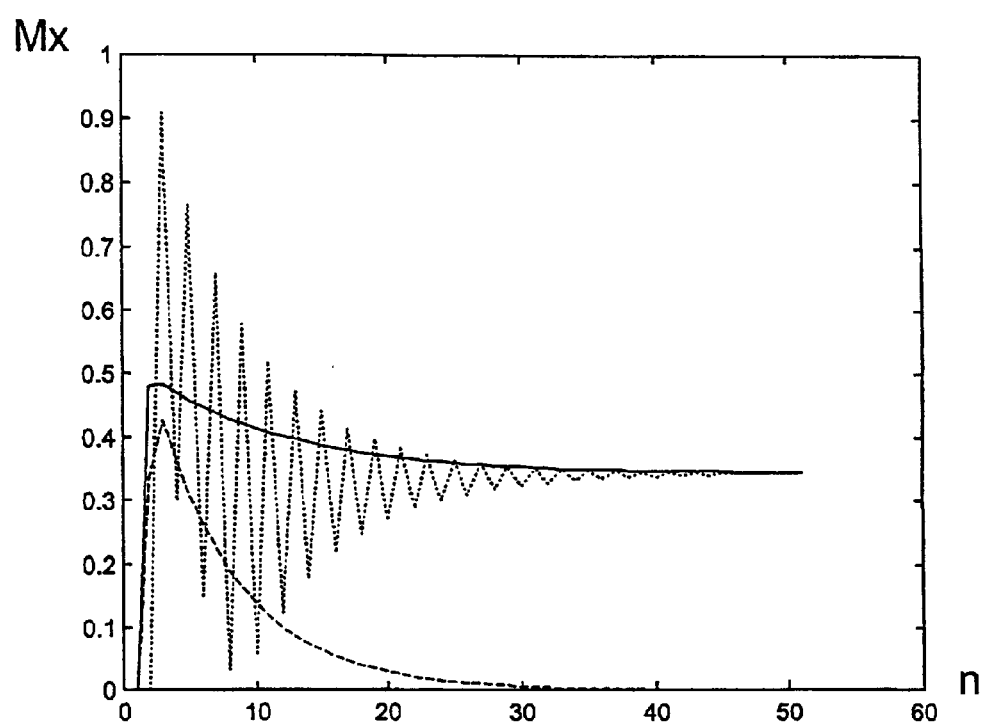
FIG. 6 shows Mx as function of n for $\Delta\phi=0°$ (full line, corresponding to FIG. 3), 180° (broken line) and 360° (dotted line)
Figure 7:
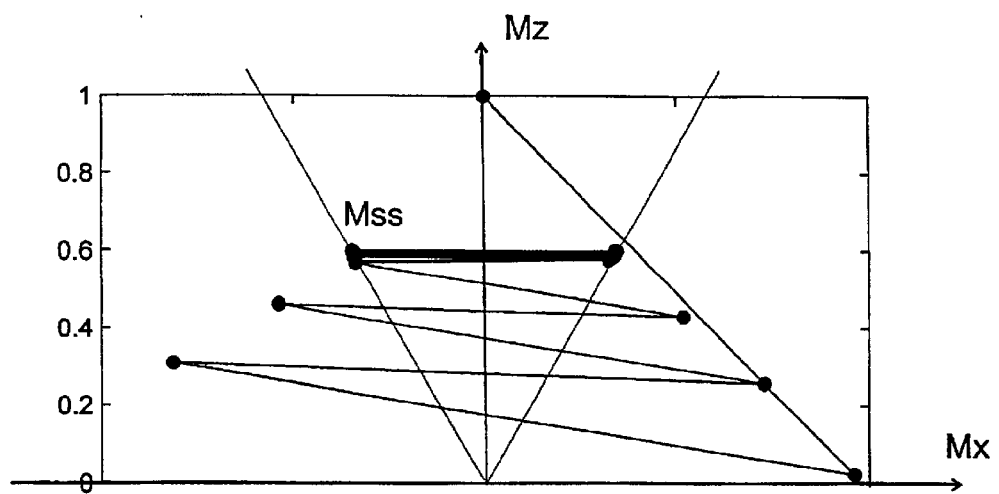
FIG. 7 shows the position of the magnetization vectors M in the x-z plane during application of RF pulses whose B1 field is oriented along the y axis (perpendicular to the plane of the image) with flip angles $\alpha_0=90°$, $\alpha_{1...n}=-160°, 140°, -120°, 100°, -80°, 60°, -60°, 60° ...$.

FIG. 7 shows the advantage of this implementation compared to conventional implementation: On the one hand, Mss is obtained in a few steps, wherein the signal amplitudes in the first n excitation steps are considerably higher than those with conventional implementation.

Figure 8:
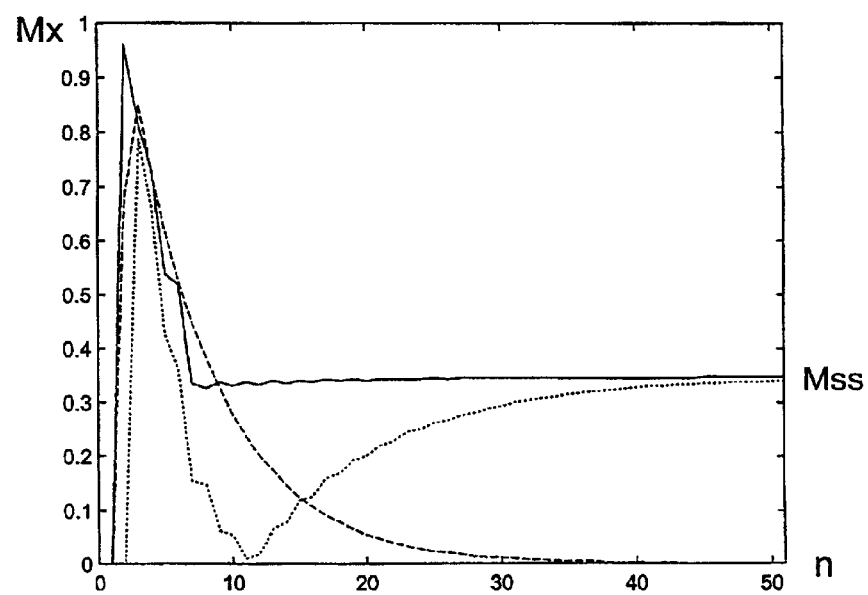
FIG. 8 shows Mx as function of n for $\Delta\phi=0°$ (full line), 180° (broken line) and 360° (dotted line) for a sequence of FIG. 7.

FIG. 8 shows that this also drastically reduces the modulations of the off-resonance spins such that the image artefacts, which currently occur during use of these signals are highly reduced.

The quality of this particularly favorable off-resonance behavior can be explained such that with flip angles in the vicinity of 180°, the spin echo character of the signals increases which is known to be characterized by a particularly favorable behavior compared to off-resonance spins.

Figure 9:
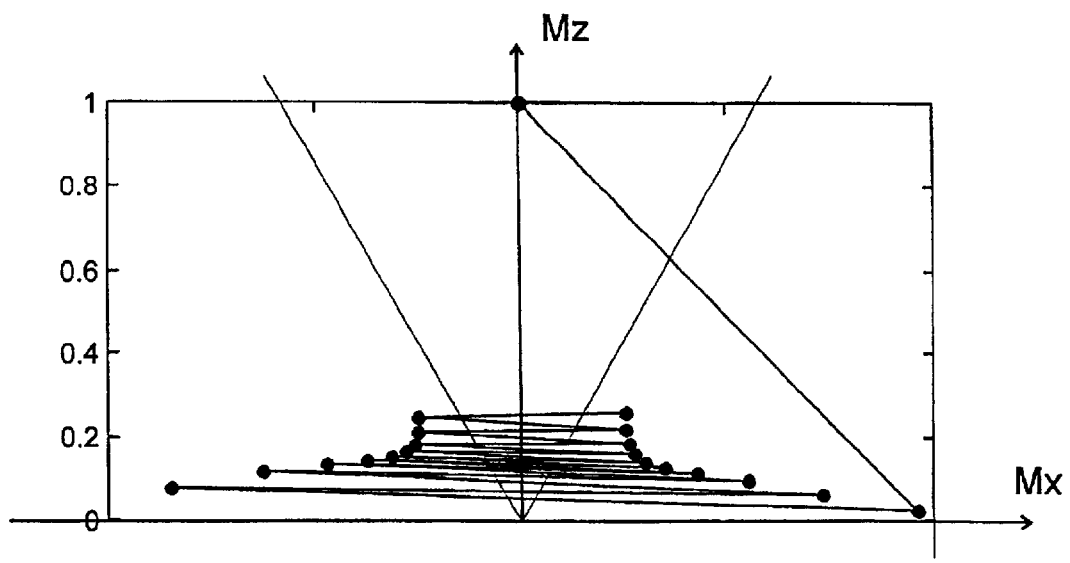
FIG. 9 shows the position of the magnetization vectors M in the x-z plane during application of RF pulses whose B1 field is oriented along the y axis (perpendicular to the plane of the image) with flip angles which approach $\alpha=60°$ in 5° steps: $\alpha_0=90°$, $\alpha_{1...n}=-175°, 170°, -165°, 160°, -155°, ..., 70°, -65°, 60°, -60°, 60° ...$.
Figure 10:
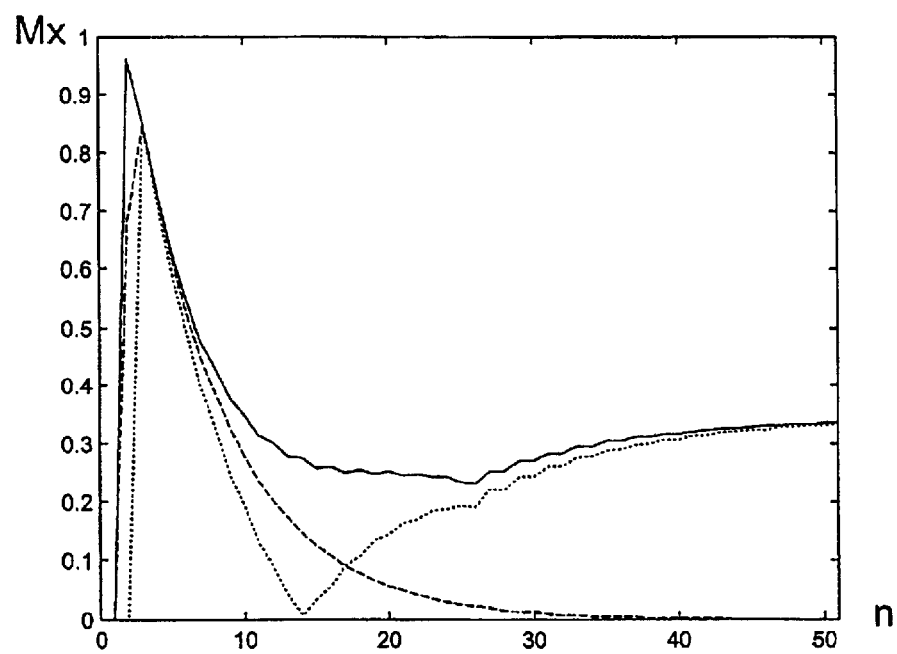
FIG. 10 shows Mx as function of n for $\Delta\phi=0°$ (full line), 180° (broken line) and 360° (dotted line) for a sequence of FIG. 9.

FIGS. 9 and 10 show that with a slow transition of the flip angles whose contribution is changed here by merely 5°, the signal behavior is further improved and the signal intensities approach monotonically Mss.

A quantitative analysis of the signal behavior is possible by means of the numerical solutions of the Bloch equation. The person skilled in the art can easily calculate therefrom corresponding flip angles for other suitable implementations.

Figure 11:
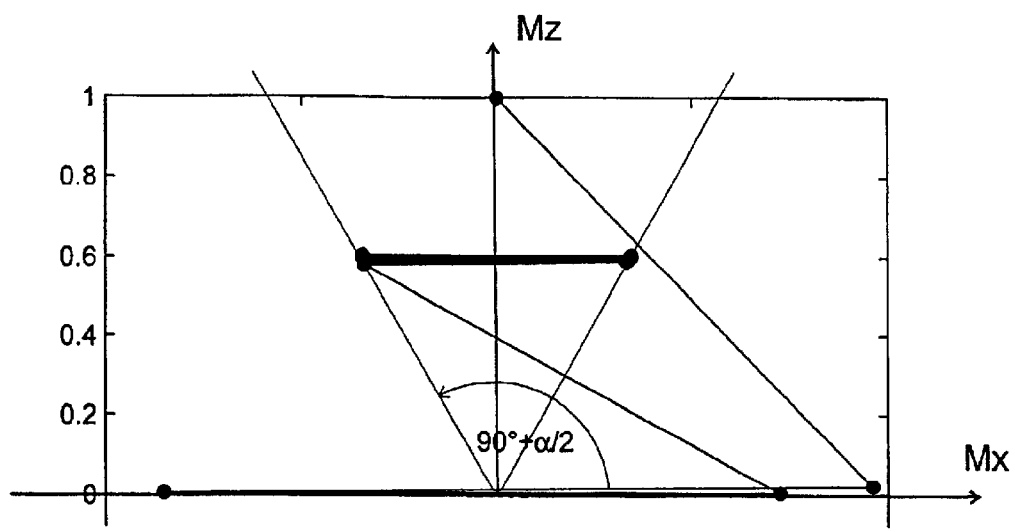
FIG. 11 shows the position of the magnetization vectors M in the x-z plane during application of RF pulses whose B1 field is oriented along the y axis (perpendicular to the plane of the image) with flip angles $\alpha_0=90°$, $\alpha_{1...n}=-180°, 180°, -120°, 60°, -60°, 60° ...$.

A second and often advantageous approach for a selection of $\alpha_{1...n}$ consists in setting the flip angles $\alpha_{1...n-1}$ to exactly or almost 180° after preparation by a 90° pulse. It is thereby important to set the nth radio frequency pulse to 90°+$\alpha$/2 to transfer the spins which are present as purely transverse magnetization after each $\alpha_{1...n}$ to the plane valid for Mss (FIG. 11).

Figure 12:
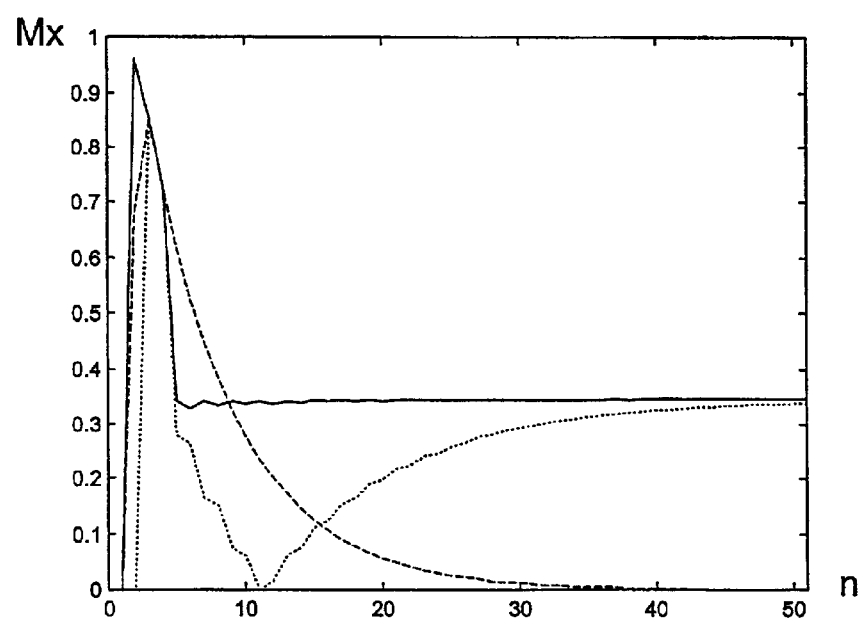
FIG. 12 shows Mx as function of n for $\Delta\phi=0°$ (full line), 180° (broken line) and 360° (dotted line) for a sequence of FIG. 11.

Selection of n which is suitable for a given application thereby depends mainly on the relaxation time T2. FIG. 12 shows the intensities for the pulse sequence shown in FIG. 11 for the selected values of T1=50 ms, T2=25 ms.

Figure 13:
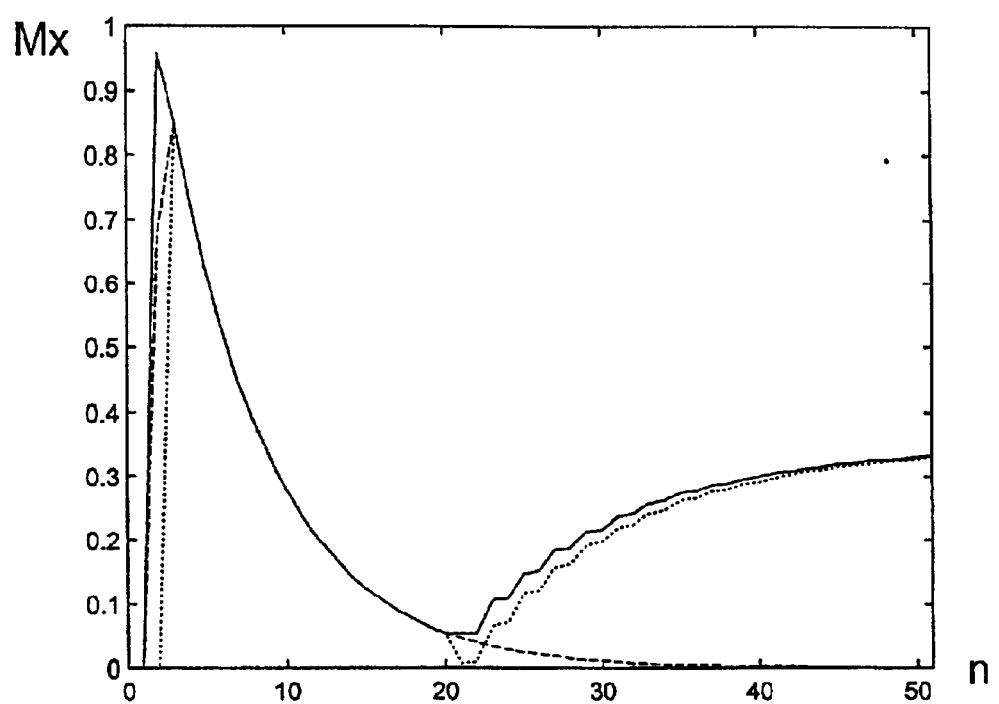
FIG. 13 shows Mx as function of n for $\Delta\phi=0°$ (full line), 180° (broken line) and 360° (dotted line) for a sequence with $\alpha_0=90°$, $\alpha_{1...20}=+-180°$, $\alpha_{21}=120°$ and $\alpha_{22...50}=+-60°$.

Even for n=0, i.e. initialisation with a 90°, 90°+$\alpha$/2 sequence, off-resonance behavior is obtained which is advantageous compared to the conventional sequence. If N is selected such that n*TR>=T2, the signal decays towards zero and recovers again only slowly in the subsequent alternating pulse sequence with α with T1 towards Mss (FIG. 13). In this manner, signals with short T2 can be very effectively suppressed for tissue with T1>>T2.

Appropriate selection of n permits variation of the T2 contrast of the signals and with corresponding selection of phase encoding, of the corresponding images: A long sequence of initial 180° pulses produces a strong T2 contrast whereas a less distinct T2 contrast is formed with only a few initial 180° pulses.

Finally, it should be noted that the magnetization which is in or close to the steady state Mss can be transferred back to a purely transverse magnetization by a radio frequency pulse with a flip angle of 90+α/2 to be transferred back into the steady state by a subsequent sequence of radio frequency pulses which again meet the above typical criteria of the method.

Figure 14:
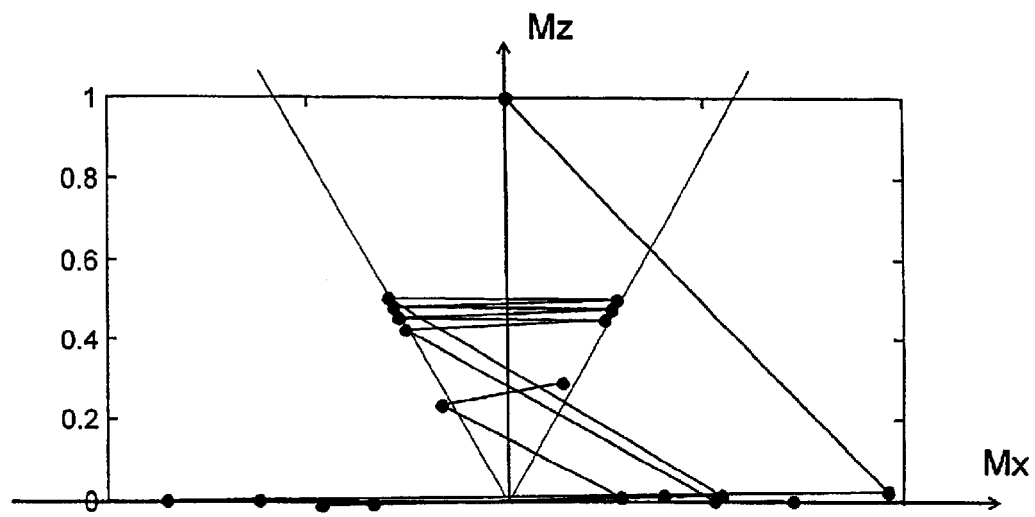
FIG. 14 shows the position of the magnetization vectors M in the x-z plane during application of RF pulses whose B1 field is oriented along the y axis (perpendicular to the plane of the image) with flip angles $\alpha_0=90°$, $\alpha_{1...12}=\alpha_{13...24}=\cdots =-180, 120, -60, 60, -60, 60, -60, 60, -60, 60, -60, 120$.
Figure 15:
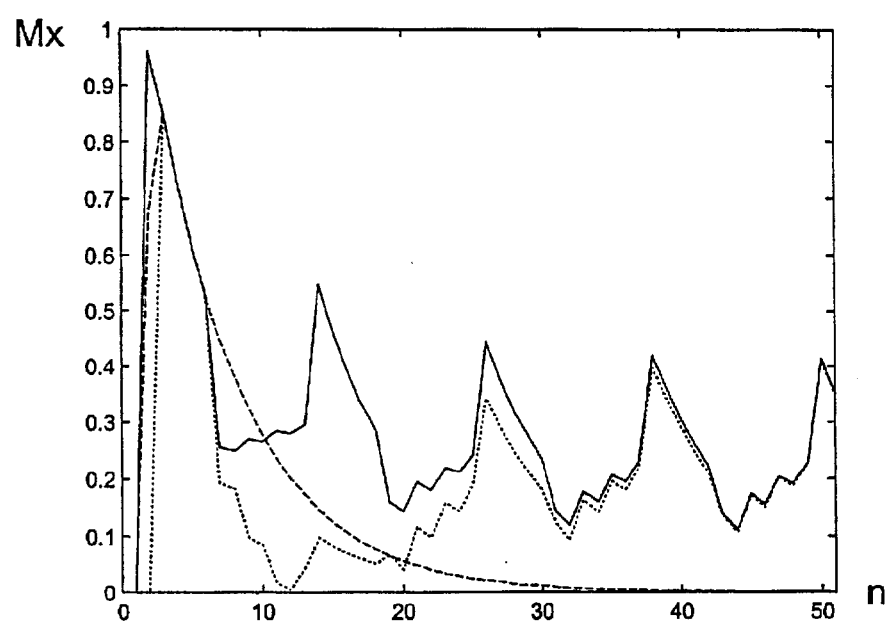
FIG. 15 shows Mx as function of n for $\Delta\phi=0°$ (full line, corresponds to FIG. 3), 180° (broken line) and 360° (dotted line) for a sequence according to FIG. 14.

Such repetition of several periods of pure 180° pulses with alternating phase is shown in FIG. 14. FIG. 15 shows the corresponding magnetizations.

The method can be combined with the additional contrast modifications shown in DE 44 27 497 A1 by corresponding preparation pulses or pulse sequences. In addition to the frequently used two-dimensional Fourier transformation, phase encoding can be effected in a three-dimensional phase encoding method.

Recordings of several slices by sequential excitation of parallel slices are also possible and can be realized for obtaining images of corresponding contrast and in a manner straightforward to the expert.

Change of the phase relation of subsequent radio frequency pulses different from the phase alternation up to now is possible which can be used for optimising signals of off-resonant spins (e.g. for separating fatty vs. water signals). Towards this end, the phase offset $\Delta\phi=TR\Delta\Omega$ of the pulses corresponding to the off-resonance spins to be observed is subtracted from the alternating phase (corresponds to 180° of the phase change of subsequent radio frequency pulses).

Logical transfer of the method to methods for image encoding according to other methods as e.g. filtered back projection is also within the scope of the present invention.

I claim:

1. Method of NMR (=nuclear magnetic resonance) tomography for producing NMR gradient echo signals according to the principle of signal generation in the driven equilibrium (DE) or also steady state free precession (SFP) wherein a periodic sequence of radio frequency pulses with a flip angle α is applied with a time delay TR wherein the phase of these radio frequency pulses is alternated by a method comprising preceding the periodic sequence of radio frequency pulses by a sequence of (n+1) radio frequency pulses for which the following conditions are valid:

a first excitation pulse with a preferred flip angle $\alpha_0=90$ precedes an equidistant sequence of radio frequency pulses at a preferred separation TR/2, the equidistant sequence of radio frequency pulses being part of the sequence of (n+1) radio frequency pulses, a flip angle $\alpha_1$ of the subsequent radio frequency pulse is approximately twice the flip angle of the first excitation $\alpha_0$ and preferably equal to or approximately equal to 180°, the flip angle $\alpha_i$ of the ith radio frequency pulse in the region of i=2 ... n is selected such that $\alpha_i$ is smaller than or equal to $\alpha_{i-1}$ and larger or equal to α wherein not all flip angles $\alpha_1 \ldots \alpha_n$ are identical and the phases of these radio frequency pulses alternate //.//, the conditions enabling transfer of initial magnetization into the DE after a few excitation periods in order that fluctuating signals from off-resonance spins are prevented.

2. Method according to claim 1, further comprising applying, in addition to the sequence of radio frequency pulses, magnetic field gradients for encoding an MR image corresponding to a two- or multi-dimensional Fourier transform method such that through application of a slice selection gradient during the radio frequency pulses a slice is selected;

a gradient echo is formed by application of a read gradient which is initially switched like a gradient echo method and then amplitude-reversed, phase encoding is performed before reading of the gradient echo.

3. Method according to claim 2, wherein the phase encoding is effected through application of a phase encoding gradient perpendicular to the read gradient in the sense of a two-dimensional Fourier transformed method.

4. Method according to claim 2, wherein the phase encoding is effected through application of several phase encoding gradients in perpendicular directions to the phase encoding in the sense of a multi-dimensional Fourier transformed method.

5. Method according to claim 1, wherein the sequence is preceded by a spin preparation through an inverted pulse for signal weighting with T1.

6. Method according to claim 1, wherein application of the magnetic field gradients is performed corresponding to image encoding according to the method of filtered back projection.

7. Method according to claim 1, wherein after m radio frequency pulses with m>n initially a radio frequency pulse with flip angle 90°+α/2 are applied such that the formed magnetization in or close to the steady state is transferred into transverse magnetization and subsequently transferred through repetition of the sequence of radio frequency pulses back into the steady state.

8. Method according to claim 7, wherein return of the magnetization into transverse magnetization is repeated several times.

9. Method of NMR (=nuclear magnetic resonance) tomography for producing NMR gradient echo signals according to the principle of signal generation in the driven equilibrium (DE) or also steady state free precession (SFP) wherein a periodic sequence of radio frequency pulses with a flip angle α is applied with a time delay TR wherein the phase of these radio frequency pulses is alternated by a method comprising preceding the periodic sequence of radio frequency pulses by a sequence of (n+1) radio frequency pulses for which the following conditions are valid:

a first excitation pulse with a preferred flip angle $\alpha_0=90$ precedes the equidistant sequence of radio frequency pulses at a preferred separation TR/2, the equidistant sequence of radio frequency pulses being part of the sequence of (n+1) radio frequency pulses, a flip angle $\alpha_1$ of the subsequent radio frequency pulse is approximately twice the flip angle of the first excitation $\alpha_0$ and preferably equal to or approximately equal to 180°, the flip angle $\alpha_i$ of the ith radio frequency pulse in the region of i=2 ... n is selected such that $\alpha_i$ is smaller than or equal to $\alpha_{i-1}$ and larger or equal to α with alternating phase, the flip angles $\alpha_{1-n}$ of the radio frequency pulses drop linearly from 180° to α; and the phases of these radio frequency pulses alternate //.//, the conditions enabling transfer of initial magnetization into the DE after a few excitation periods in order that fluctuating signals from off-resonance spins are prevented.

10. Method of NMR (=nuclear magnetic resonance) tomography for producing NMR gradient echo signals according to the principle of signal generation in the driven equilibrium (DE) or also steady state free precession (SFP) wherein a periodic sequence of radio frequency pulses with a flip angle $\alpha$ is applied with a time delay TR wherein the phase of these radio frequency pulses is alternated by a method comprising preceding the periodic sequence of radio frequency pulses by a sequence of (n+1) radio frequency pulses for which the following conditions are valid:

a first excitation pulse with a preferred flip angle $\alpha_0=90$ precedes the equidistant sequence of radio frequency pulses at a preferred separation TR/2, the equidistant sequence of radio frequency pulses being part of the sequence of (n+1) radio frequency pulses, a flip angle $\alpha_1$ of the subsequent radio frequency pulse is approximately twice the flip angle of the first excitation $\alpha_0$ and preferably equal to or approximately equal to 180°, the flip angle $\alpha_i$ of the ith radio frequency pulse in the region of i=2 . . . n is selected such that $\alpha_i$ is smaller than or equal to $\alpha_{i-1}$ and larger or equal to $\alpha$ with alternating phase, the flip angles of the radio frequency pulses $\alpha_1 \ldots _{(n-1)}$ are set to 180° and $\alpha_n$ to 90°+$\alpha$/2; and the phases of these radio frequency pulses alternate //.//, the condition enabling transfer from steady state into the DE after a few excitation periods in order that fluctuating signals from off-resonance spins are prevented.

* * * * *